(12) United States Patent
Yamaguchi et al.

(10) Patent No.: US 6,245,582 B1
(45) Date of Patent: Jun. 12, 2001

(54) PROCESS FOR MANUFACTURING SEMICONDUCTOR DEVICE AND SEMICONDUCTOR COMPONENT

(75) Inventors: Masayoshi Yamaguchi, Kakubunji; Eiichi Harada, Tokyo, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/202,190

(22) PCT Filed: Apr. 13, 1998

(86) PCT No.: PCT/JP98/01681

§ 371 Date: Dec. 10, 1998

§ 102(e) Date: Dec. 10, 1998

(87) PCT Pub. No.: WO98/47175

PCT Pub. Date: Oct. 22, 1998

(30) Foreign Application Priority Data

Apr. 11, 1997 (JP) .................................................. 9-093623

(51) Int. Cl.[7] .................................................. H01L 21/66
(52) U.S. Cl. ................................ 438/14; 438/12; 438/15; 438/17
(58) Field of Search ................................ 438/10, 12, 14, 438/15, 17, 18, 118, 119

(56) References Cited

U.S. PATENT DOCUMENTS

| | | | |
|---|---|---|---|
| 5,092,033 | * 3/1992 | Nishiguchi et al. | 438/15 |
| 5,458,694 | * 10/1995 | Nuyen | 438/118 |
| 5,578,527 | * 11/1996 | Chang et al. | 438/119 |
| 5,918,113 | * 6/1999 | Higashi et al. | 438/119 |
| 5,940,679 | * 8/1999 | Tomura et al. | 438/18 |
| 6,103,553 | * 8/2000 | Park | 438/15 |

FOREIGN PATENT DOCUMENTS

| | | |
|---|---|---|
| 5-21509 | 1/1993 | (JP) . |
| 5-235094 | 9/1993 | (JP) . |
| 7-14878 | 1/1995 | (JP) . |
| 7-58152 | 3/1995 | (JP) . |
| 10-92878 | 4/1998 | (JP) . |

OTHER PUBLICATIONS

PCT International Search Report for PCT Application PCT/JP98/01681.

* cited by examiner

Primary Examiner—Kevin M. Picardat
(74) Attorney, Agent, or Firm—Finnegan, Henderson, Farabow, Garrett & Dunner L.L.P.

(57) ABSTRACT

A process for manufacturing a semiconductor comprising the step of mounting a semiconductor component on a printed circuit board, with electrodes of the semiconductor component facing to electrodes of the printed circuit board, the step of inspecting a function as a semiconductor device with the semiconductor component being mounted on the printed circuit board, the step of bonding the electrodes of the printed circuit board and the electrodes of the mounted semiconductor component to obtain the semiconductor device when the inspection result is good, and the step of replacing at least one of the printed circuit board and the semiconductor component with another one of the same type and again inspecting the function as the semiconductor device when the inspection result is not good.

19 Claims, 18 Drawing Sheets

PROCESS FOR MANUFACTURING SEMICONDUCTOR DEVICE AND SEMICONDUCTOR COMPONENT

TECHNICAL FIELD

The present invention relates to a process for manufacturing a semiconductor device that allows semiconductor devices to be obtained by mounting semiconductor components on printed circuit boards, and to a semiconductor component suitable for use during the implementation of this manufacturing process.

BACKGROUND ART

FCB (Flip Chip Bonding) and TAB (Tape Automated Bonding) are known as methods that satisfy the recent requirements for thinner and smaller mounting surfaces in cases in which semiconductor components are mounted on printed boards to manufacture semiconductor devices.

In the FCB technique, a printed circuit board 2 and a bare IC chip 3 are connected with the aid of bumps 4 composed of metal and with the aid of an anisotropic conductive film 5 obtained by admixing conductive particles 7 into resin 6, as shown in FIG. 24.

Specifically, bumps 4 are provided to the electrode pads 10 of the bare IC chip 3, yielding a bumped bare IC chip 1; and the anisotropic conductive film 5 is interposed between the aforementioned bumps 4 and the electrode pads 8 on the printed circuit board 2 in order to connect the printed circuit board 2 and this bumped bare IC chip 1. The electrode pads 10 of the bare IC chip 3 conduct current to the electrode pads 8 on the printed circuit board 2 via the bumps 4 and the conductive particles 7 of the anisotropic conductive film 5.

In addition, a semiconductor device featuring the use of the FCB technique is manufactured according to the sequence shown in FIG. 25.

A printed circuit board 2, an anisotropic conductive film 5, and a bare IC chip 3 are first prepared (S1, S2, S3).

Here, the anisotropic conductive film 5 is mounted on the electrode pads 8 of the printed circuit board 2, and the components are tacked (S4) using an apparatus for adhering anisotropic conductive films (not shown).

In addition, a bumped bare IC chip 1 is configured (S5) by employing a wire bonding apparatus (not shown) to form bumps 4 on the electrode pads 10 of the bare IC chip 3, and the components are then electrically inspected and rejected if classified as faulty (S6).

The serviceable bumped bare IC chip 1 is mounted with the aid of a bonding (FCB) apparatus on the printed circuit board 2 carrying a tack-mounted anisotropic conductive film 5, mechanical pressure is applied to render the area between the bumps 4 and the electrode pads 8 electrically conductive through the agency of the conductive particles 7 of the anisotropic conductive film 5, and the bumped bare IC chip 1 is bonded to (mounted on) the printed circuit board 2 by applying heat with a heater to perform thermocompression bonding (S7).

After the bumped bare IC chip 1 has been mounted on the printed circuit board 2, functional inspection is performed (S8) by bringing the probe pins (not shown) of inspection equipment into contact with the chip to discard faulty components, and serviceable components are retrieved from the bonding apparatus, yielding a completed semiconductor device (S9).

Meanwhile, the TAB technique involves mounting film carrier LSIs on printed circuit boards. A semiconductor device featuring the use of the TAB technique is manufactured according to the sequence shown in FIG. 26.

Printed circuit boards and film carrier LSIs are first prepared (S10, S11).

Here, the film carrier LSIs are individually inspected for functionality (S12), and faulty components are rejected.

Serviceable film carrier LSIs are subsequently placed and bonded at prescribed locations on the printed circuit boards with the aid of a bonding (TAB) apparatus, and the film carrier LSIs are mounted on the printed circuit boards (S13).

The components are then functionally inspected (S14) by bringing them into contact with the probes (not shown) of inspection equipment, and serviceable components are retrieved form the bonding apparatus, yielding a completed semiconductor device (S18).

If it is established by the functional inspection (S14) performed following mounting that a semiconductor device is faulty, the film carrier LSIs are dismounted from the printed circuit boards (S15), it is determined whether the printed circuit boards and film carrier LSIs (S16, S17) are faulty or serviceable, faulty components are rejected, and serviceable film carrier LSIs and printed circuit boards are reused in the step (S13) for mounting film carrier LSIs on printed circuit boards.

It should be noted that the FCB technique described with reference to FIGS. 24 and 25 is disadvantageous in that when a decision is made that a semiconductor device is faulty as a result of a post-mounting functional inspection (S8), bumped bare IC chips and printed circuit boards are collectively discarded, with the result that bumped bare IC chips or printed circuit boards that are not necessarily faulty are also discarded.

In view of this, it has been proposed to use anisotropic conductive films of low adhesive strength that allow bumped bare IC chips to be easily dismounted from printed circuit boards, and to adopt an arrangement in which bumped bare IC chips are dismounted from printed circuit boards with the aid of a repair apparatus, and serviceable parts are reused if a functional inspection indicates the presence of faulty components.

Using anisotropic conductive films of low adhesive strength, however, not only lowers the reliability of semiconductor devices obtained by mounting bumped bare IC chips on printed circuit boards but has the additional drawback of requiring time-consuming repairs.

Meanwhile, a drawback of the TAB technique described with reference to FIG. 26 is that when a semiconductor device is classified as a faulty component, and a film carrier LSI is dismounted from a printed circuit board, the film carrier LSI tends to break because of its thinness, and expensive repair equipment is required to prevent this.

An object of the present invention, which is aimed at overcoming the above-described shortcomings of prior art, is to provide a process for manufacturing a semiconductor device that makes it possible to prevent waste from being created by the rejection of serviceable parts for printed circuit boards and semiconductor devices during the fabrication of such semiconductor devices, and allows such semiconductor devices to be easily dismounted from the printed circuit boards without the use of repair apparatus when a component has been classified as faulty during the fabrication of semiconductor devices, making it possible to achieve higher working efficiency.

Another object of the present invention is to provide a semiconductor component suitable for use during the implementation of the above-described process for manufacturing a semiconductor device.

DISCLOSURE OF THE INVENTION

The process for manufacturing a semiconductor device according to claim 1 is a process for manufacturing a semiconductor device by mounting a semiconductor component on a printed circuit board to produce the semiconductor device, characterized in that the process comprising the steps of:

mounting the semiconductor component on the printed circuit board, with electrodes of the semiconductor component facing to electrodes of the printed circuit board;

inspecting a function as the semiconductor device with the semiconductor component being mounted on the printed circuit board;

bonding the electrodes of the printed circuit board and the electrodes of the mounted semiconductor component to obtain a semiconductor device when the inspection result is good; and replacing at least one of the printed circuit board and the semiconductor component with another one of the same type, and again inspecting the function as the semiconductor device when the inspection result is not good.

Because this arrangement involves inspecting the function expected from a semiconductor device while a semiconductor component is mounted on a printed circuit board but the electrodes of the printed circuit board and the electrodes of the semiconductor component are not yet bonded, the unbonded printed circuit board and/or semiconductor component can be very easily discarded or replaced with another one of the same type separately from each other in case of unfavorable inspection results, making it possible to prevent the components from being wasted during the manufacture of semiconductor device and to increase the working efficiency during the manufacture of semiconductor devices.

The process for manufacturing a semiconductor device according to claim 2 is characterized in that a pressure is applied so as to adequately connect together the electrodes of the printed circuit board and the electrodes of the semiconductor component contacting with the electrodes of the printed circuit board in a state in which the semiconductor component is mounted on the printed circuit board.

This arrangement allows adequate electrical contact to be maintained between the printed circuit board and the semiconductor component.

The process for manufacturing a semiconductor device according to claim 3 is characterized in that the semiconductor component is a bare IC chip.

This arrangement allows an unbonded printed circuit board and/or bare IC chip alone to be discarded easily and independently if an inspection of the function expected from the semiconductor device produces unfavorable inspection results while the bare IC chip is mounted on the printed circuit board.

The process for manufacturing a semiconductor device according to claim 4 is characterized in that the semiconductor component is a bare IC chip and the bare IC chip is provided with connection electrode pads for connection to the electrodes of the printed circuit board on one side thereof and inspection electrode pads for inspection on the other side thereof which is opposite to the one side.

This arrangement allows inspections to be easily performed using inspection electrode pads provided on the other side of a bare IC chip when these electrode pads are concealed by bringing electrode pads provided on one side of the bare IC chip into contact with the electrodes of a printed circuit board.

The process for manufacturing a semiconductor device according to claim 5 is characterized in that the electrodes of the printed circuit board and the electrodes of the bare IC chip to be connected to the electrodes of the printed circuit board are bonded with the aid of an anisotropic conductive material.

This arrangement allows the type of bonding between the electrodes of a printed circuit board and the electrodes of a bare IC chip to be appropriately selected in accordance with a variety of conditions.

The process for manufacturing a semiconductor device according to claim 6 is characterized in that the semiconductor component is a bare IC chip, the bare IC chip is provided with bumps formed on the connection electrode pads for connection to the electrodes of the printed circuit board, and is connected to the printed circuit board via the bumps.

This arrangement allows secure electrical connections to be established between the electrodes on the printed circuit board and the electrodes on the bare IC chip through the agency of bumps.

The process for manufacturing a semiconductor device according to claim 7 is characterized in that the functional inspection is performed by bringing inspection pins into contact with the inspection electrode pads of the bare IC chip.

This arrangement allows the necessary inspection to be performed by bringing inspection pins into contact with arbitrary electrodes to obtain signals or the like from the necessary electrodes.

The process for manufacturing a semiconductor device according to claim 8, characterized in that the inspection electrode pads on the bare IC chip are sealed with a resin sealant.

This arrangement allows the inspection electrode pads on a bare IC chip to be protected with high efficiency.

The process for manufacturing a semiconductor device according to claim 9 is characterized in that the semiconductor component is a film carrier LSI.

This arrangement allows an unbonded printed circuit board and/or film carrier LSI alone to be discarded easily and independently if an inspection of the functions expected from a semiconductor device produces unfavorable inspection results, while the film carrier LSI is mounted on the printed circuit board.

The process for manufacturing a semiconductor device according to claim 10, characterized in that the functional inspection is performed by bringing inspection pins into contact with the electrodes of the printed circuit board.

This arrangement allows the necessary inspection to be performed by bringing inspection pins into contact with arbitrary electrodes to obtain signals or the like from the necessary electrodes.

The process for manufacturing a semiconductor device according to claim 11 is characterized in that the electrodes of a printed circuit board and the electrodes of a film carrier LSI are bonded by intermetallic bonding.

This arrangement allows the type of bonding between the electrodes of a printed circuit board and the electrodes of a film carrier LSI to be appropriately selected in accordance with a variety of conditions.

The process for manufacturing a semiconductor device according to claim 12 is characterized in that the electrodes of the printed circuit board and the electrodes of the film carrier LSI are bonded by means of an anisotropic conductive material.

This arrangement allows the type of bonding between the electrodes of a printed circuit board and the electrodes of a film carrier LSI to be appropriately selected in accordance with a variety of conditions.

The semiconductor component according to claim 13 is a semiconductor component constituting a semiconductor device to be mounted on a printed circuit board, characterized in that the semiconductor component is provided with connection electrode pads for connection to electrodes of the printed circuit board on one side thereof and inspection electrode pads for inspection on the other side thereof which is opposite to the one side thereof.

This arrangement allows an inspection to be easily performed using inspection electrode pads provided on the other side of a semiconductor component when these electrode pads are concealed by bringing electrode pads provided on one side of the semiconductor component into contact with the electrodes of a printed circuit board.

The semiconductor component according to claim 14 is characterized by being a bare IC chip.

This arrangement allows an unbonded printed circuit board and/or bare IC chip alone to be discarded easily and independently if an inspection of the functions expected from a semiconductor device produces unfavorable inspection results while the bare IC chip is mounted on the printed circuit board.

The semiconductor component according to claim 15 is characterized in that the bare IC chip is provided with bumps formed on the connection electrode pads for connection to the electrodes of the printed circuit board, and is connected to the printed circuit board via the bumps.

This arrangement allows secure electrical connections to be established between the electrodes on the printed circuit board and the electrodes on the bare IC chip through the agency of bumps.

BEST MODE FOR CARRYING OUT THE INVENTION

The best mode for carrying out the process for manufacturing a semiconductor device and obtaining the semiconductor component in accordance with the present invention will now be described in detail with reference to the accompanying drawings.

In the figures, redundancy is avoided by using the same symbols to designate identical constituent elements.

A first aspect of the embodiment, depicted in FIGS. 1 through 12, pertains to a process for manufacturing a semiconductor device by mounting bare IC chips on a printed circuit board by the FCB technique. This process for manufacturing a semiconductor device is carried out in accordance with the sequence disclosed in FIG. 1 (flowchart).

In this process for manufacturing a semiconductor device, a printed circuit board 2, an anisotropic conductive film (ACF) 5, and a bare IC chip (semiconductor component) 3 are first prepared (S1, S2, S3), as shown in FIGS. 2 and 3.

Figure 1:
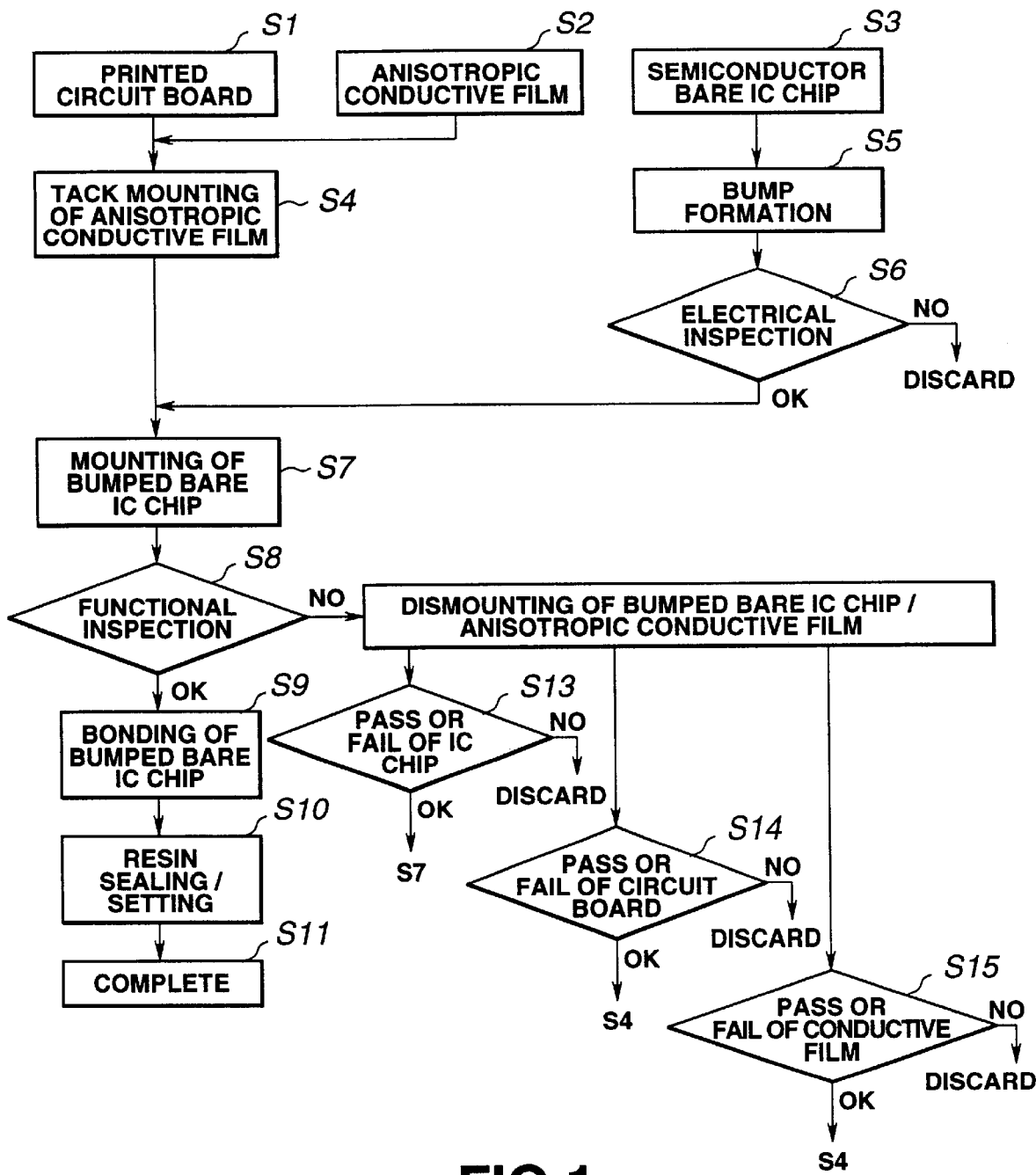
FIG. 1 is a flowchart depicting a first aspect of the embodiment for mounting a bare IC chip by the FCB technique on a printed circuit board in the process for manufacturing a semiconductor device in accordance with the present invention.
Figure 2A:
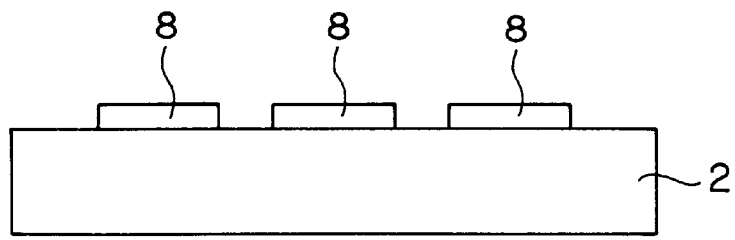
FIGS. 2(a) and 2(b) are side views depicting a printed circuit board and the manner in which an anisotropic conductive film is tack-mounted on this printed circuit board.
Figure 2B:
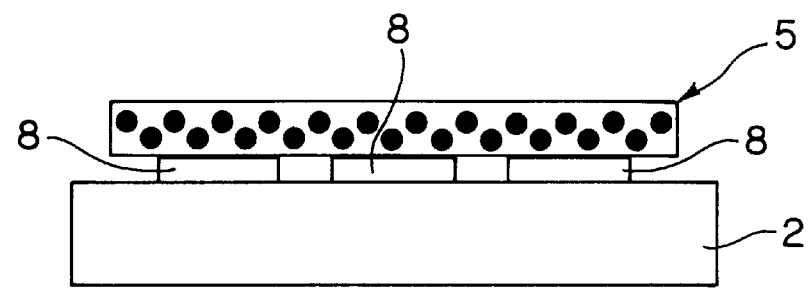

The printed circuit board 2 is provided with electrode pads 8, 8, . . . at prescribed locations on the surface thereof (as shown in FIG. 2(a)), and the anisotropic conductive film 5 is mounted and tacked (S4) on the side of the electrode pads 8, 8, . . . of the printed circuit board 2 thus prepared (as shown in FIG. 2(b)).

Figure 3A:
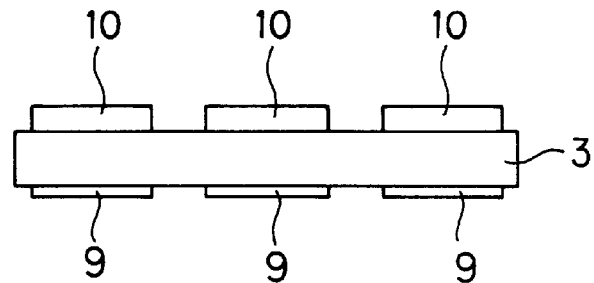
FIGS. 3(a) and 3(b) are side views depicting the bare IC chip pertaining to the present invention, and the manner in which bumps are formed on this bare IC chip.

Meanwhile, electrode pads 10, 10, . . . for connection to the electrode pads 8, 8, . . . of the above-described printed circuit board 2 are provided on one side (upper side in FIG. 3(a)) of the bare IC chip 3 (as shown in the drawing), and inspection electrode pads 9, 9, . . . are provided on the other side (lower side in the drawing) of the bare IC chip 3.

Here, the aforementioned inspection electrode pads 9, 9, . . . can be provided in the same manner (number, arrangement, and the like) as the electrode pads 10, 10, . . . It is also possible for the electrode pads 9, whose number is determined by the requirements of the below-described functional inspection, to be disposed at arbitrary positions unrelated to the manner in which the electrode pads 10, 10, . . . are provided.

Figure 3B:
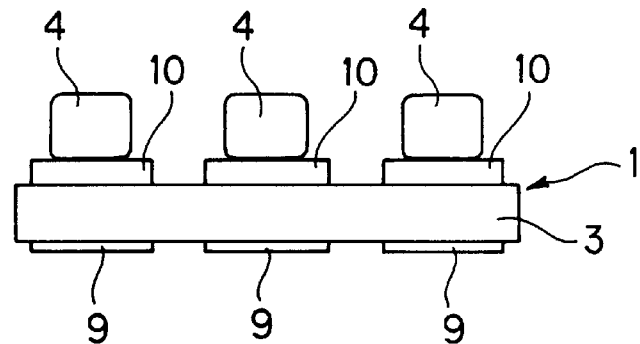

Bumps 4, 4, . . . are formed (S5) with the aid of a wire bonding apparatus (not shown) on the electrode pads 10, 10, . . . of the bare IC chip 3 thus prepared, as shown in FIG. 3(b), yielding a bumped bare IC chip 1.

The bumped bare IC chip 1 thus configured is inspected electrically (its performance as an IC chip is inspected) (S6) and discarded if classified as a faulty component as a result of this electrical inspection.

Figure 4:
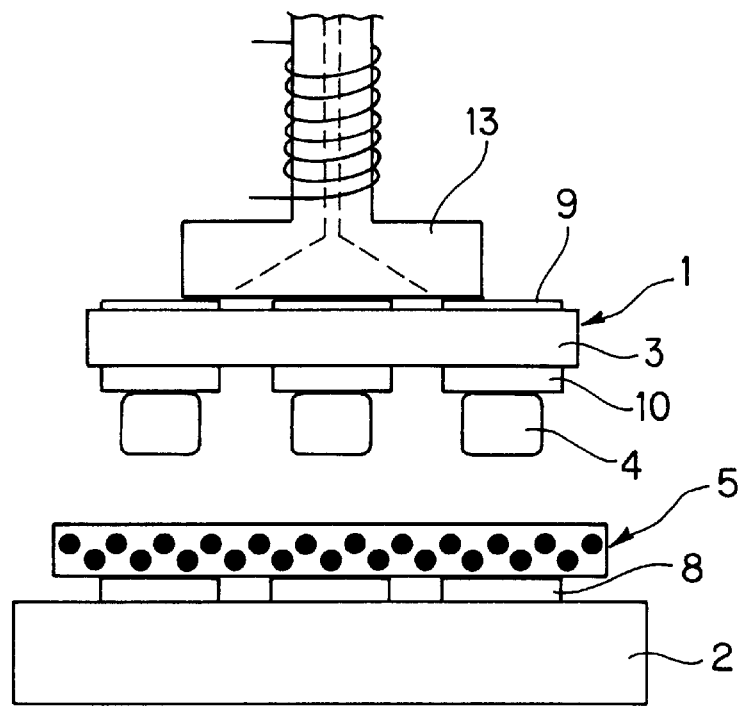
FIG. 4 is a conceptual diagram depicting a bumped bare IC chip, an anisotropic conductive film, and a printed circuit board in a set state.
Figure 5:
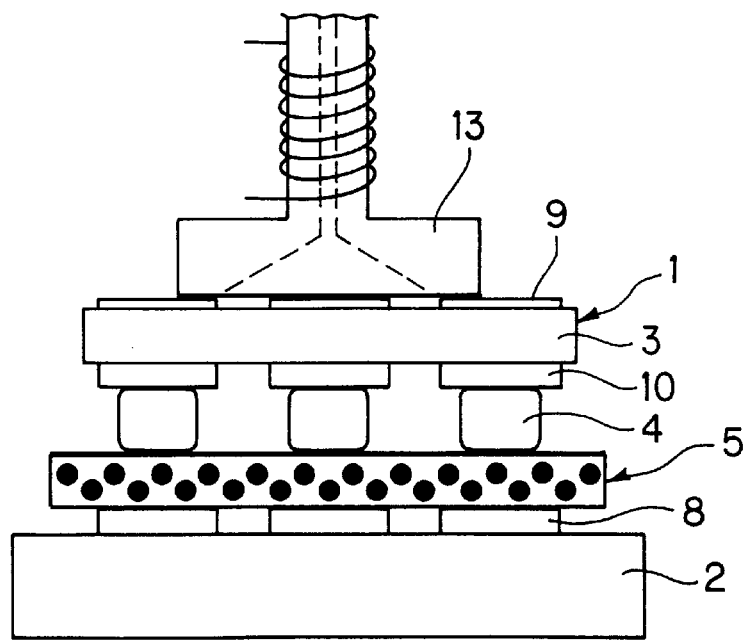
FIG. 5 is a conceptual diagram illustrating a step for mounting a bumped bare IC chip on a printed circuit board.

If classified as a serviceable component as a result of the electrical inspection (S6), the bumped bare IC chip 1 is held in an inverted state by the heater-equipped collet 13 of a bonding (FCB) apparatus as shown in FIG. 4, is positioned relative to the electrode pads 8, 8, . . . of the printed circuit board 2 having an anisotropic conductive film 5 tacked thereto, and is mounted as shown in FIG. 5 (S7).

Figure 6:
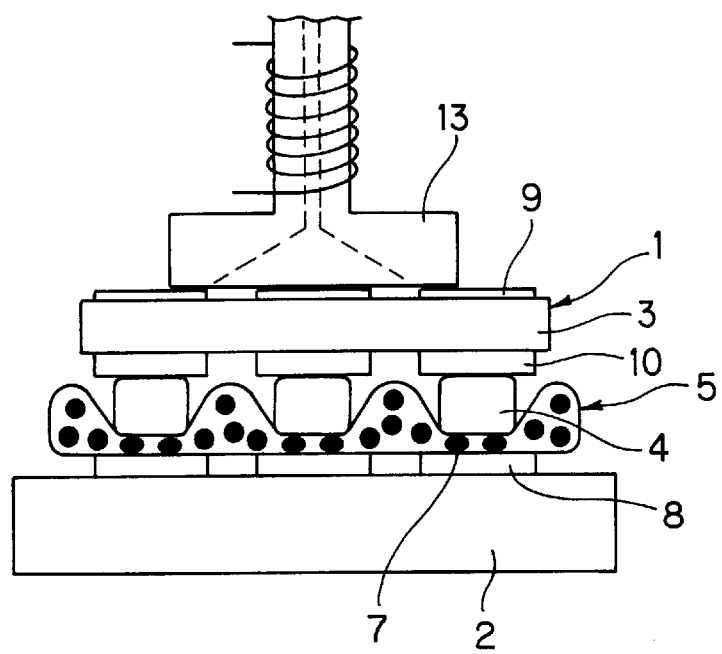
FIG. 6 is a conceptual diagram depicting an anisotropic conductive film to which pressure is applied.
Figure 7:
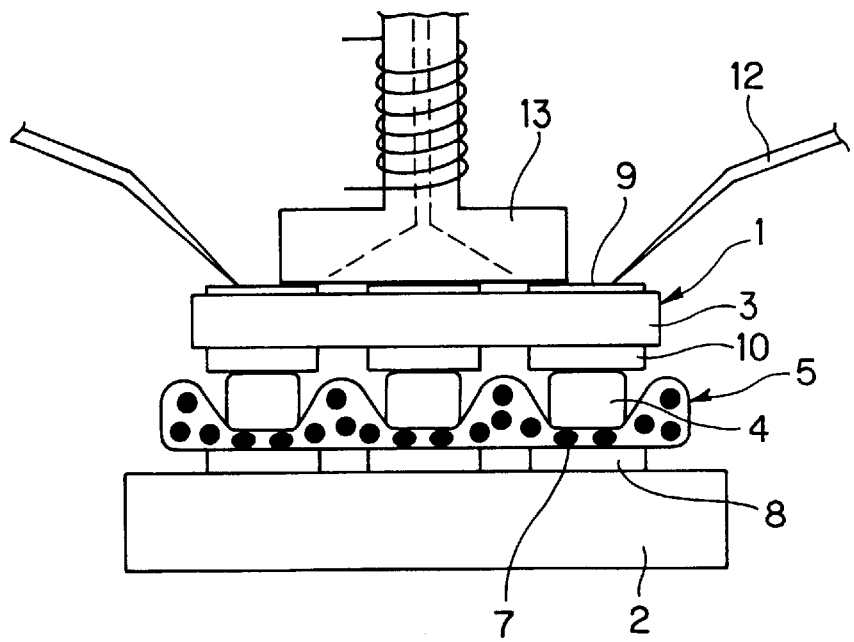
FIG. 7 is a conceptual diagram illustrating a functional inspection step.

At this point, mechanical pressure is applied to the anisotropic conductive film 5 in the manner shown in FIG. 6, and conductivity is established between the bumps 4 of the bumped bare IC chip 1 and the electrode pads 8 on the printed circuit board 2 through the agency of the conductive particles 7, 7, . . . in the anisotropic conductive film 5.

In this state, inspection probe pins 12 are brought into contact with the inspection electrode pads 9, 9, . . . of the bumped bare IC chip 1 to inspect the functions expected from a semiconductor device (S8).

Here, since the inspection electrode pads 9, 9, . . . of the bumped bare IC chip 1 are provided on the opposite side from the side on which the electrode pads 10, 10, . . . for connection to the electrodes 8, 8, . . . of the printed circuit board 2 are provided to the bare IC chip 3, the pads 9, 9, . . . are exposed on the surface side (the upper surface side in the drawing) of the bumped bare IC chip 1 even when the electrode pads 10 of the bumped bare IC chip 1 are concealed by being brought into contact with the electrode pads 8 of the printed circuit board 2 through the agency of bumps 4.

Consequently, the inspection probe pins 12 can be brought easily and steadily into contact with the inspection electrode pads 9 of the bumped bare IC chip 1, making it possible to inspect the functions expected from a semiconductor device in a secure manner.

Figure 8:
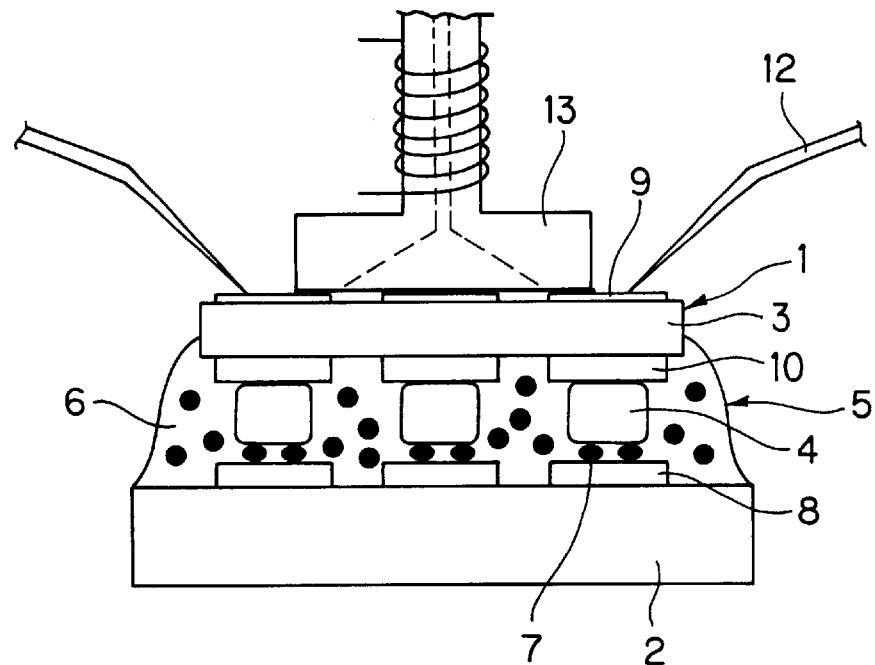
FIG. 8 is a conceptual diagram illustrating a step for bonding a printed circuit board and a bumped bare IC chip.

If it has been determined as a result of the functional inspection (S8) that the component is serviceable, the bumped bare IC chip 1 is bonded to (mounted on) the printed circuit board 2 (S9) by passing electric current through the heater of the heater-equipped collet 13 to exert pressure and generate heat in a state in which conduction is established between the bumps 4 and the electrode pads 8 through the agency of conductive particles 7, 7, . . . , thereby breaking up the conductive particles 7 of the anisotropic conductive film 5, melting the resin 6, and allowing it to solidify, as shown in FIG. 8.

If there is concern that the inspection probe pins 12 and the circuits of the inspection equipment connected to these probe pins 12 will be subjected to thermal stress and caused to break when current is passed through the heater of the heater-equipped collet 13, the aforementioned circuits and the like can be prevented from breaking by placing the probe pins 12 at a distance from the bumped bare IC chip 1.

Figure 9:
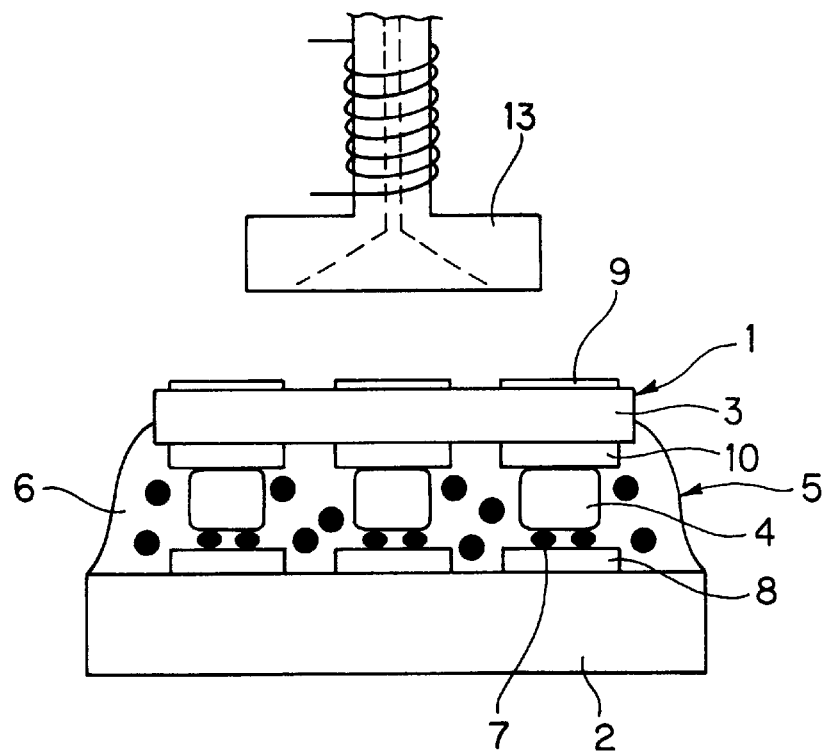
FIG. 9 is a conceptual diagram depicting the state achieved by a heater-equipped collet separated from a bumped bare IC chip.
Figure 10:
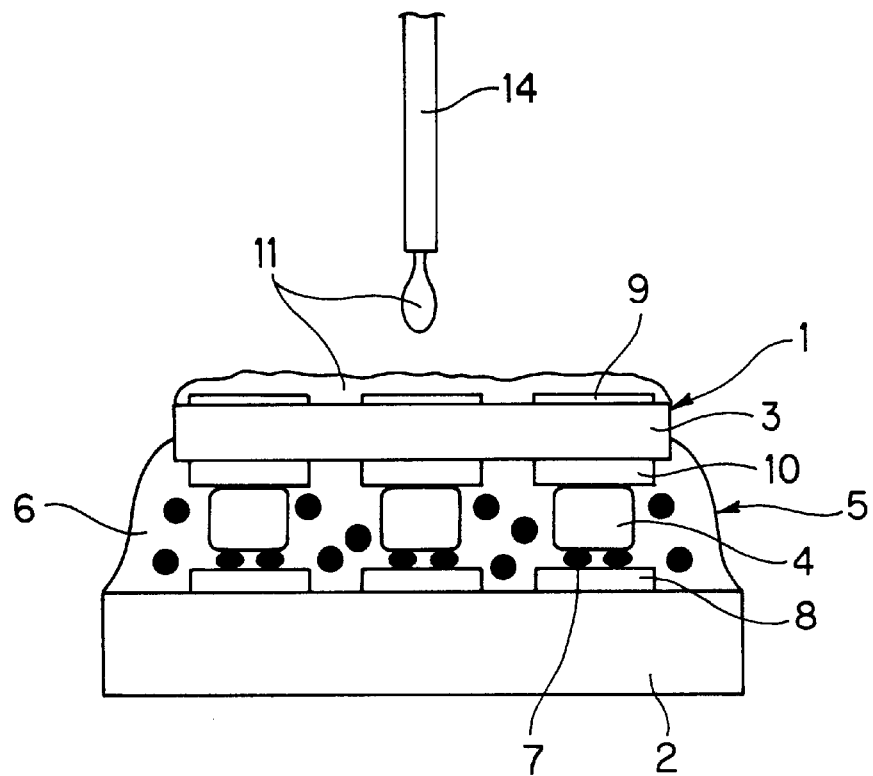
FIG. 10 is a conceptual diagram illustrating a resin sealing step.
Figure 11:
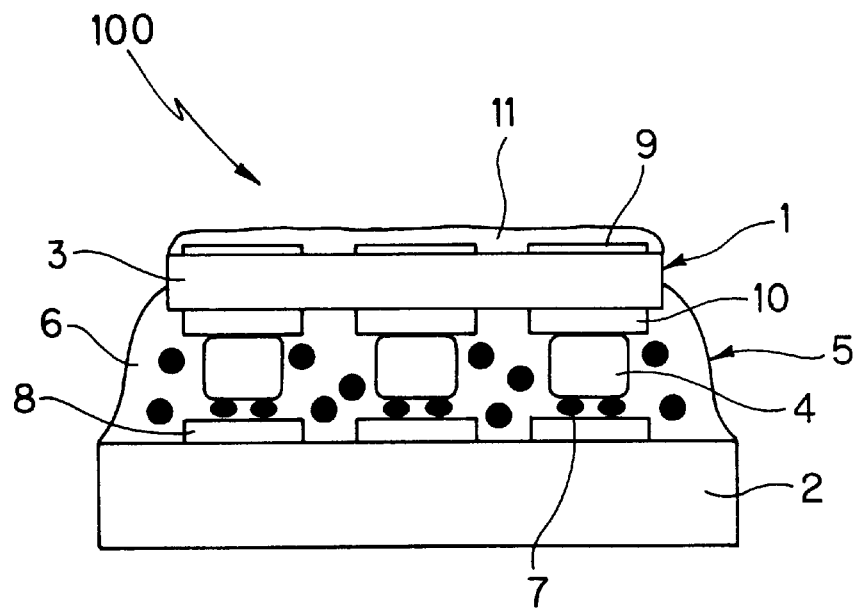
FIG. 11 is a conceptual diagram depicting a completed semiconductor device.

The heater-equipped collet 13 and the probe pins 12 (not shown) are then retracted from the bumped bare IC chip 1 as shown in FIG. 9, the dispenser nozzle 14 of a bonding (FCB) apparatus is subsequently lowered as shown in FIG. 10, a resin sealant 11 is applied or added in drops to the inspection electrode pads 9, 9, . . . of the bumped bare IC chip 1, and resin sealing is achieved by allowing this resin sealant to set (S10), yielding the semiconductor device 100 shown in FIG. 11 (S11).

Figure 12A:
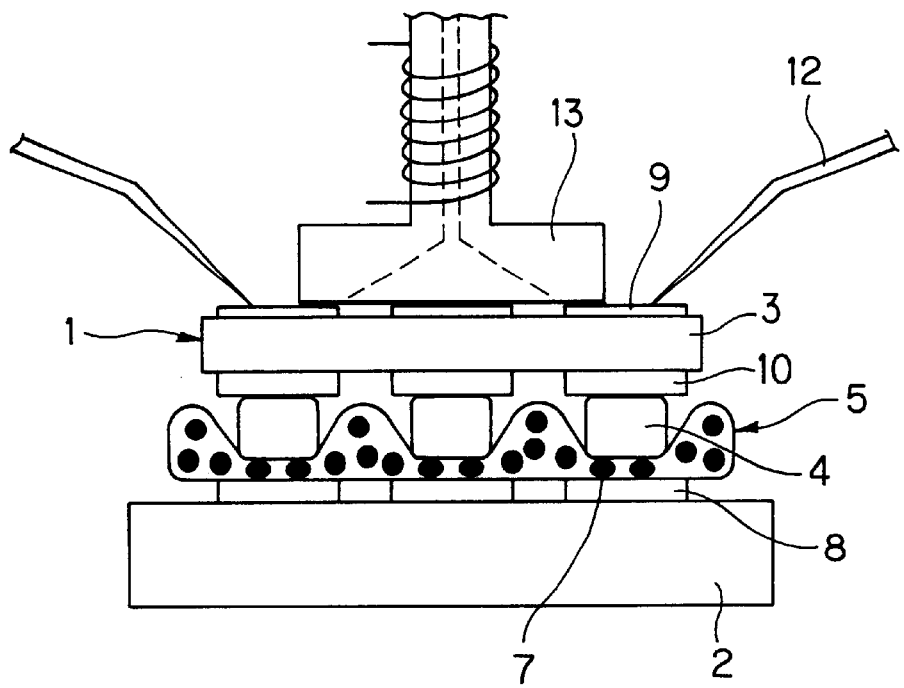
FIGS. 12(a) and 12(b) are conceptual diagrams illustrating the step performed when a component has been classified as faulty during a functional inspection.
Figure 12B:
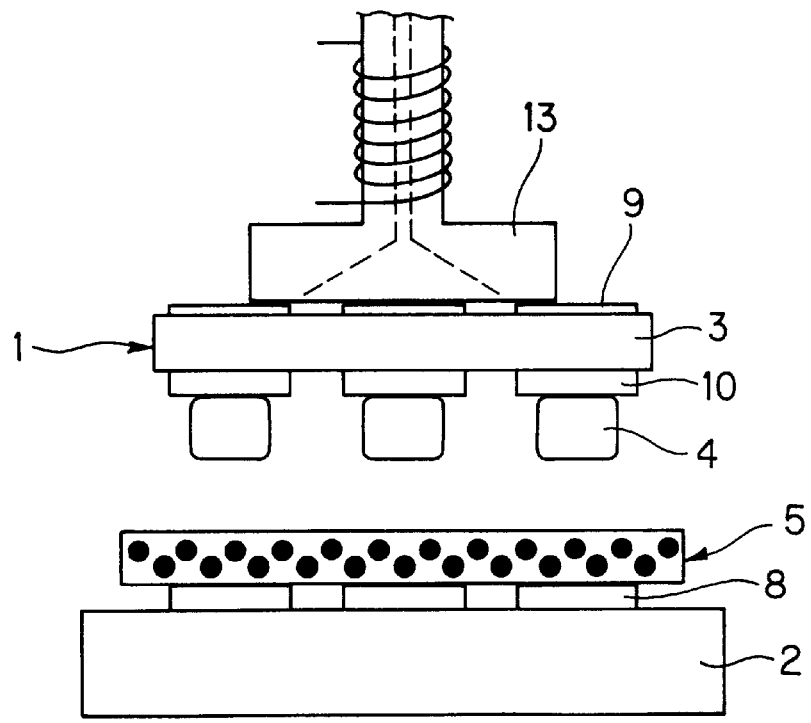

When classified as faulty during the above-described functional inspection (S8), the component is held by the heater-equipped collet 13 of the bonding (FCB) apparatus as shown in FIG. 12(b) from the functional inspection state depicted in FIG. 12(a), the bumped bare IC chip 1 is dismounted (S12) from the printed circuit board 32 by the lifting of the heater-equipped collet 13, and the tacked anisotropic conductive film 5 is dismounted from the printed circuit board 2.

A measuring instrument is then used to determine whether the bumped bare IC chip 1 retrieved from the bonding (FCB) apparatus is a faulty or serviceable component (S13), and a faulty component is discarded while a serviceable bumped bare IC chip 1 is reused for the step (S7) in which the bumped bare IC chip 1 is mounted on the printed circuit board 2 having a tacked anisotropic conductive film 5.

In addition, measuring instruments are used to determine whether the anisotropic conductive film 5 and the printed circuit board 2 retrieved from the bonding (FCB) apparatus are faulty or serviceable (S14, S15), and faulty components are discarded while a serviceable printed circuit board 2 and a serviceable anisotropic conductive film 5 are reused for the step (S4) in which the anisotropic conductive film 5 is mounted on (and tacked to) the printed circuit board 2.

Although in the above-described embodiment the bumped bare IC chip 1 and the printed circuit board 2 were bonded with the aid of an anisotropic conductive film 5, it is also possible to replace the anisotropic conductive film with an anisotropic conductive paste composed of the same anisotropic conductive material, in which case a printed circuit board 2 classified as faulty is discarded together with the anisotropic conductive paste applied to the printed circuit board 2.

According to the first aspect of the above-described embodiment, a functional inspection is performed in a state in which a bumped bare IC chip 1 is mounted on a printed circuit board 2 through the agency of an anisotropic conductive film 5 before the bumped bare IC chip 1 and the printed circuit board 2 are bonded with the aid of the anisotropic conductive film 5, with the result that if a component is classified as a faulty semiconductor device, the bumped bare IC chip 1 can be easily separated from the printed circuit board 2, making it possible to improve working efficiency during the manufacture of semiconductor devices.

In addition, an increase in the economic efficiency related to the manufacture of semiconductor devices can be achieved because serviceable components (bumped bare IC chip 1, printed circuit board 2, and anisotropic conductive film 5) can be reused after the separation of the bumped bare IC chip 1 from the printed circuit board 2.

A second aspect of the embodiment, depicted in FIGS. 13 through 23, pertains to a process for manufacturing a semiconductor device by mounting film carrier LSIs on a printed circuit board by the TAB technique. This process for manufacturing a semiconductor device is carried out in accordance with the sequence disclosed in FIG. 13 (flowchart).

Figure 14A:
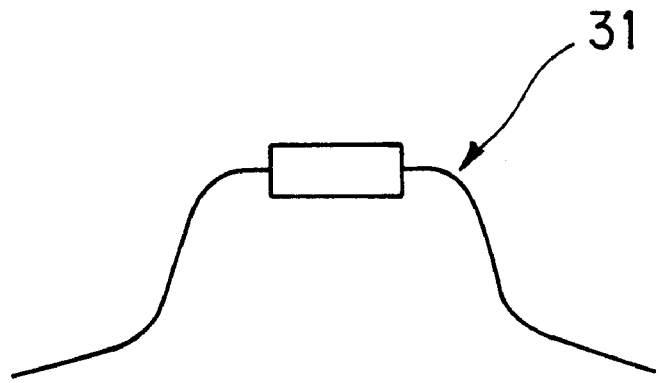
FIGS. 14(a) and 14(b) are side views depicting a film carrier LSI and a printed circuit board.
Figure 14B:
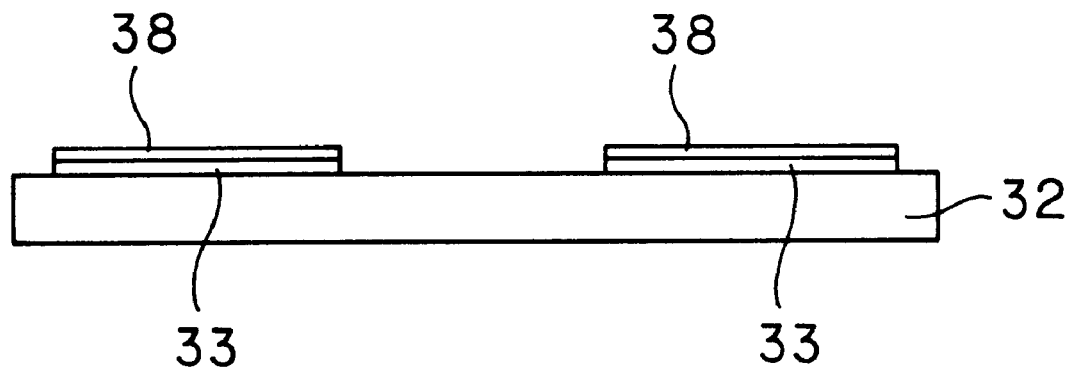

In this process for manufacturing a semiconductor device, a film carrier LSI 31 (semiconductor component) and a printed circuit board 32 provided with electrodes 33, 33, are first prepared (S1, S2), as shown in FIGS. 14(a) and 14(b).

Here, solder 38 is fed in advance to the surfaces of the electrodes 33 of the printed circuit board 32.

Figure 15:
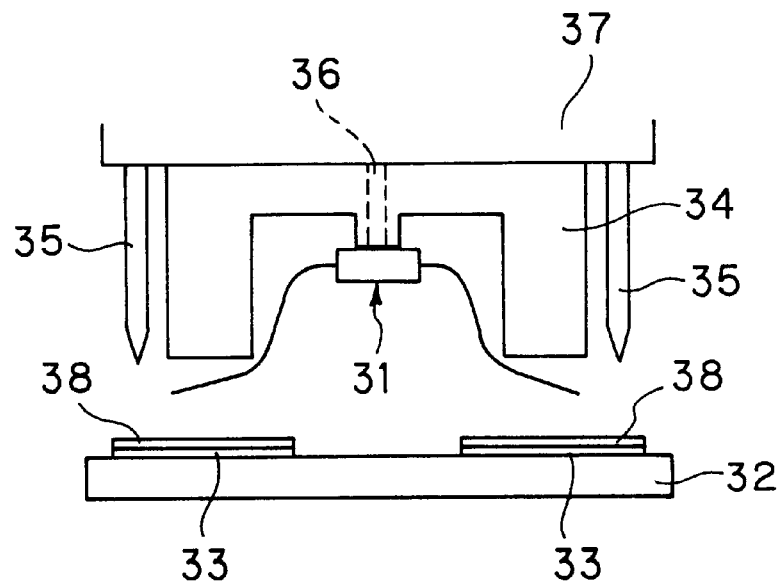
FIG. 15 is a conceptual diagram depicting a film carrier LSI and a printed circuit board in a set state.

The film carrier LSI 31 thus prepared is subsequently held by a component-holding nozzle 36 provided to the bonding head 37 of a bonding (TAB) apparatus, as shown in FIG. 15.

Figure 16:
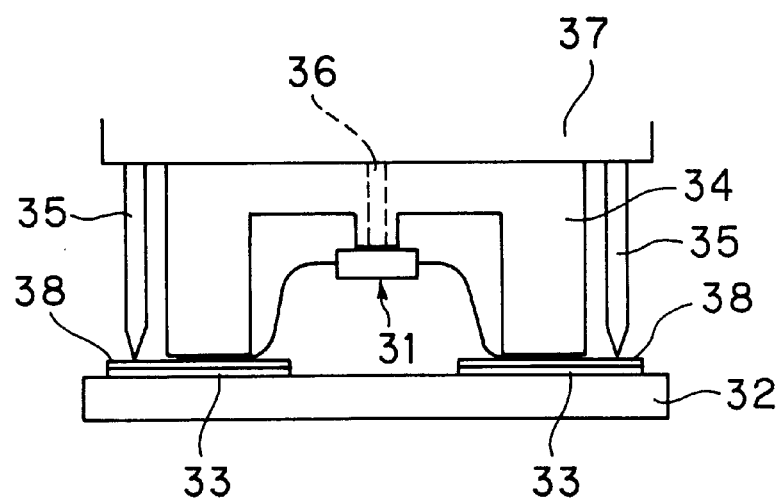
FIG. 16 is a conceptual diagram illustrating a step for mounting a film carrier LSI on a printed circuit board, and a functional inspection step.

The leads of the film carrier LSI 31 and the electrodes 33 on the printed circuit board 32 are then aligned as shown in FIG. 16, the bonding head 37 is lowered, and the film carrier LSI 31 is mounted on the printed circuit board 32 (S3).

The aforementioned leads and electrodes 33 are brought into contact with each other, and inspection pins 35 provided to the bonding head 37 are brought into contact with the required electrodes 33 in a state in which solely the pressure from a thermocompression bonding tool 34 is applied.

The inspection pins 35 are thus brought into contact with the electrodes 33, and a semiconductor device composed of the film carrier LSI 31 and the printed circuit board 32 is functionally inspected (S4).

Figure 17:
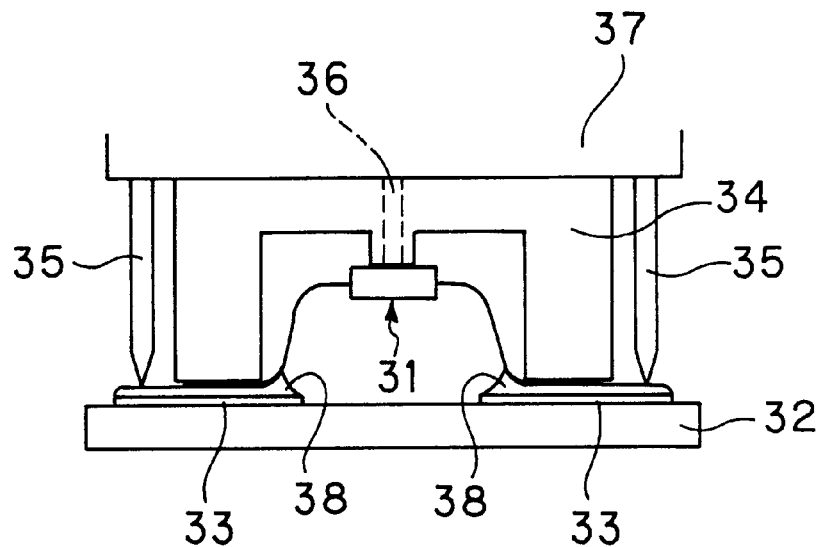
FIG. 17 is a conceptual diagram illustrating a step for bonding a printed circuit board and a film carrier LSI.

If the component is classified as serviceable as a result of the functional inspection (S4), the solder 38 is heated and melted by the thermocompression bonding tool 34, and the film carrier LSI 31 is mounted on the printed circuit board 32 by soldering and bonding the leads of the film carrier LSI 31 and the electrodes 33 on the printed circuit board 32, as shown in FIG. 17 (S5).

Figure 18:
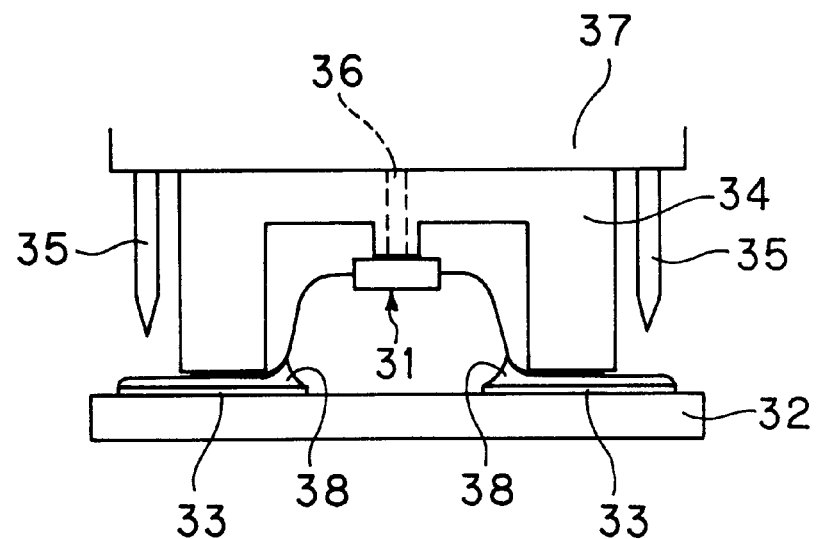
FIG. 18 is a conceptual diagram depicting the state occasionally achieved by an inspecting pin separated from a printed circuit board.

Here, the inspection pins 35 are provided such that they can move in the vertical direction in relation to the bonding head 37 separately from the thermocompression bonding tool 34. If there is concern that the inspection pins 35 and the circuits of the inspection equipment connected to these pins 35 will be subjected to thermal stress and caused to break during soldering, the aforementioned circuits and the like can be prevented from breaking by lifting the inspection pins 35 and moving them away from the electrodes 33, as shown in FIG. 18.

Figure 19:
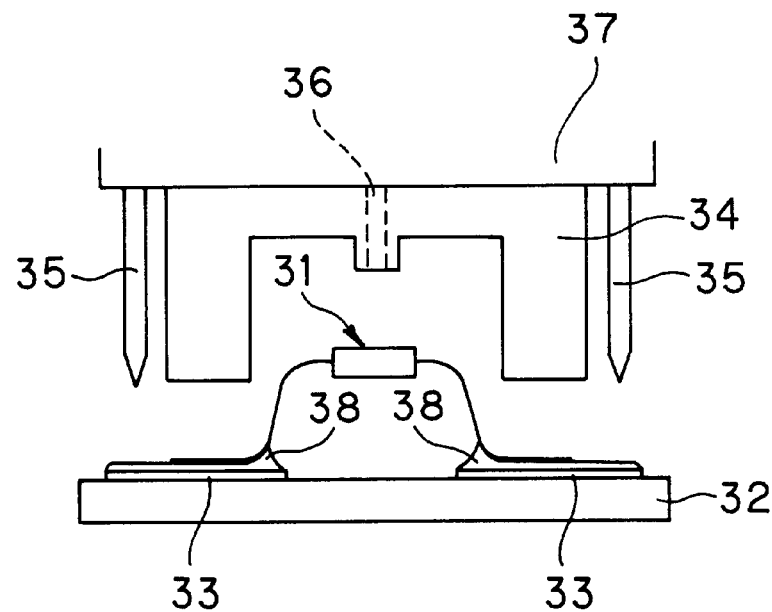
FIG. 19 is a conceptual diagram depicting the state achieved by a bonding head separated from a film carrier LSI.
Figure 20:
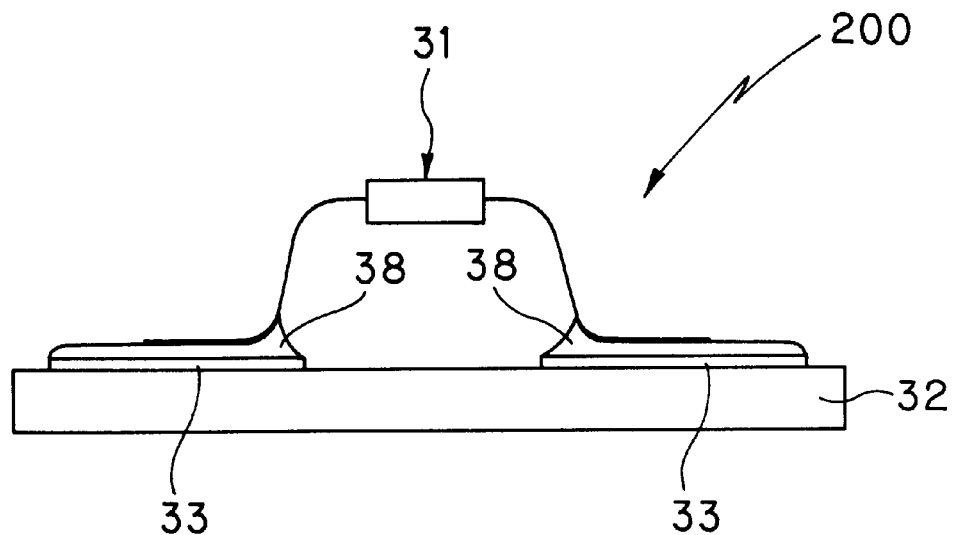
FIG. 20 is a conceptual diagram depicting a completed semiconductor device.

After the aforementioned leads and electrodes 33 have been soldered together, the bonding head 37 of the bonding (TAB) apparatus is lifted as shown in FIG. 19, and the thermocompression bonding tool 34 and the inspection pins 35 are retracted and retrieved from the bonding (TAB) apparatus, yielding the semiconductor device 200 shown in FIG. 20 (S6).

Figure 21A:
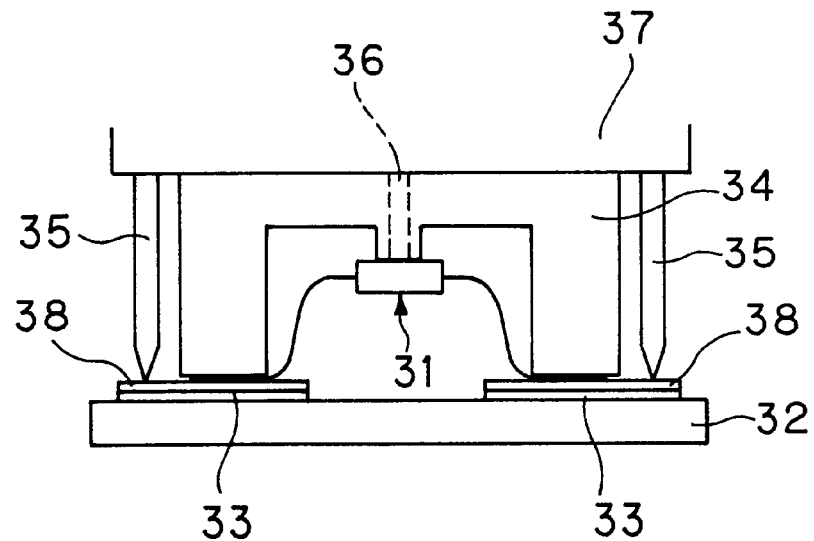
FIGS. 21(a) and 21(b) are conceptual diagrams illustrating the step performed when a component has been classified as faulty during a functional inspection.
Figure 21B:
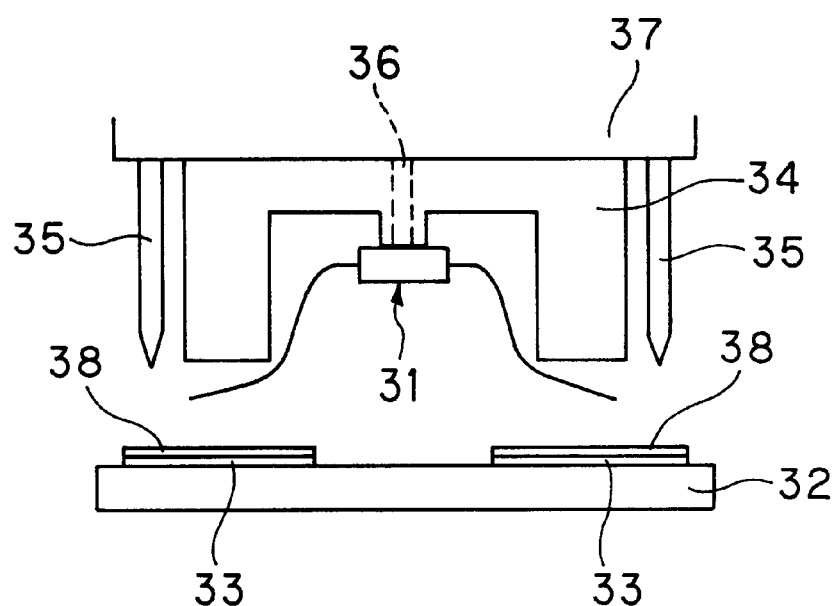

If classified as faulty as a result of the above-described functional inspection (S4), the film carrier LSI 31 is held by the component-holding nozzle 36 provided to the bonding head 37 of the bonding (TAB) apparatus (as shown in FIG. 21(b)) from the state of the functional inspection (as shown in FIG. 21(a)) and the film carrier LSI 31 is dismounted from the printed circuit board 32 by the lifting of the bonding head 37 (S7).

A measuring instrument is then used to determine whether the film carrier LSI 31 retrieved from the bonding (TAB) apparatus is faulty or serviceable (S8), and a faulty component is discarded while a serviceable film carrier LSI 31 is reused for the step (S3) in which the printed circuit board 32 is mounted on the film carrier LSI 31.

A measuring instrument is also used to determine whether the printed circuit board 32 retrieved from the bonding (TAB) apparatus is faulty or serviceable (S9), and a faulty component is discarded while a serviceable printed circuit board 32 is reused for the step (S3) in which the film carrier LSI 31 is mounted on the printed circuit board 32.

Figure 13:
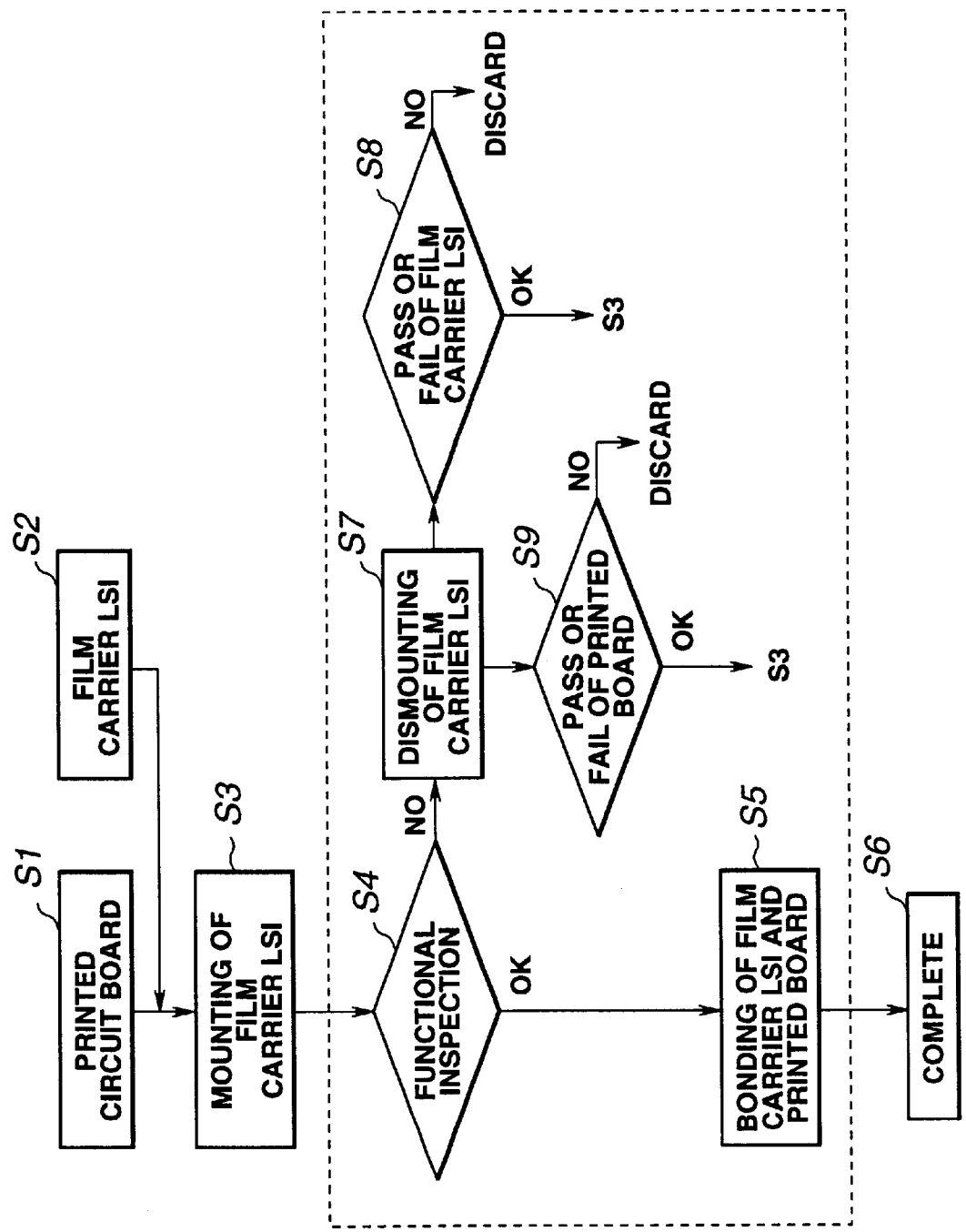
FIG. 13 is a flowchart depicting a second aspect of the embodiment for mounting a film carrier LSI by the TAB technique on a printed circuit board in the process for manufacturing a semiconductor device in accordance with the present invention.

In the steps enclosed in a broken line in FIG. 13, a series of procedures can be performed using the same equipment, making it possible to manufacture semiconductor devices with high efficiency.

According to the second aspect of the above-described embodiment, a functional inspection is performed in a state in which a film carrier LSI 31 is mounted and electrically connected to a printed circuit board 32 before the film carrier LSI 31 and the printed circuit board 32 are bonded with the aid of solder 38 with the result that if a component is classified as a faulty semiconductor device, the film carrier LSI 31 can be easily separated from the printed circuit board 32, making it possible to improve working efficiency during the manufacture of semiconductor devices.

In addition, an increase in the economic efficiency related to the manufacture of semiconductor devices can be achieved because a serviceable component (film carrier LSI 31 or printed circuit board 32) can be reused after the separation of the printed circuit board 32 and the film carrier LSI 31.

Figure 22A:
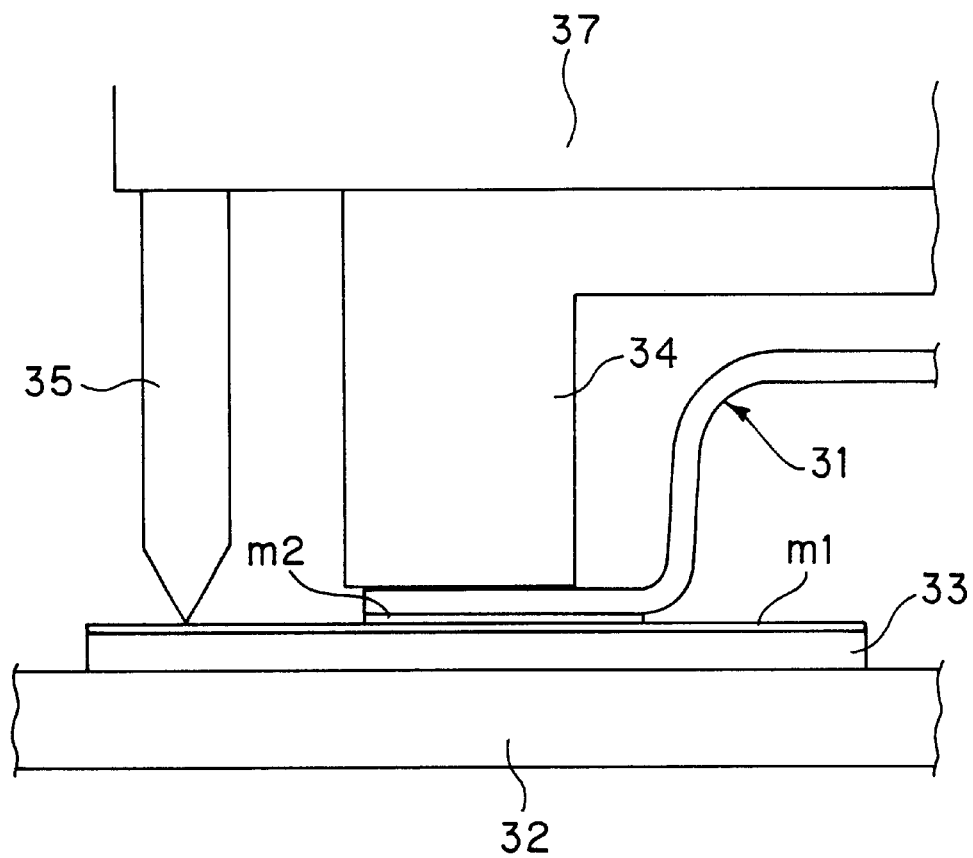
FIGS. 22(a) and 22(b) are conceptual diagrams depicting an embodiment in which a film carrier LSI is bonded to a printed circuit board by intermetallic bonding.
Figure 22B:
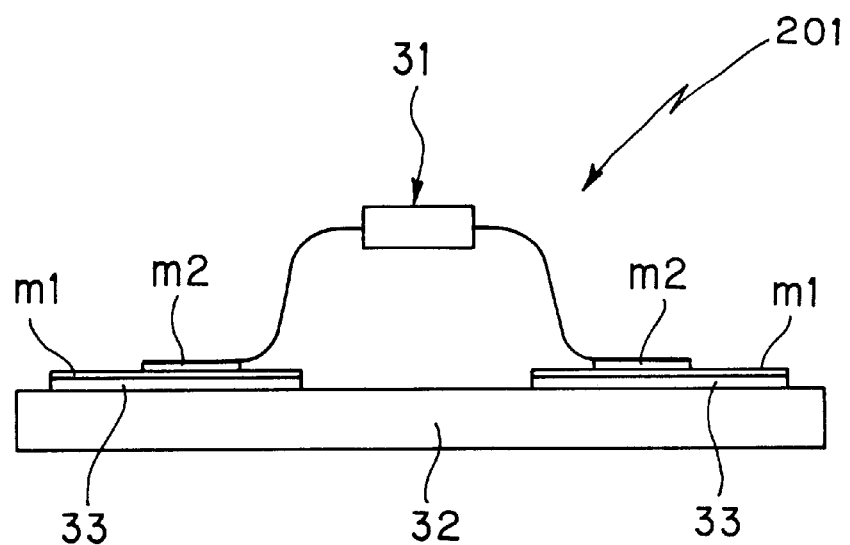

It should be noted that although the second aspect of the above-described embodiment involved bonding a film carrier LSI 31 and a printed circuit board 32 with the aid of solder 38, it is also possible to bond the film carrier LSI 31 and the printed circuit board 32 to produce a semiconductor device 201 by the thermocompression bonding (intermetallic bonding) of a gold (Au) or silver (Ag) metal layer ml formed by means of plating on the surfaces of the electrodes 33 of the printed circuit board 32, and a tin (Sn) metal layer m2 formed by means of plating on the lead surfaces of the film carrier LSI 31, as shown in FIGS. 22(a) and 22(b).

Figure 23A:
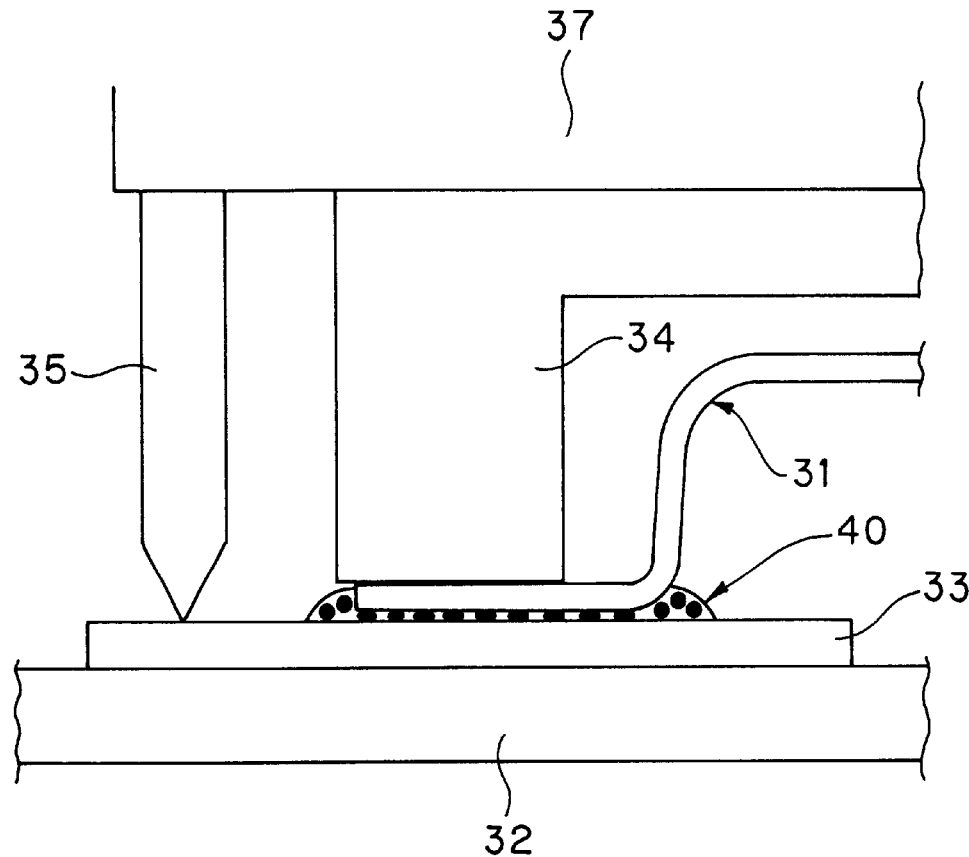
FIGS. 23(a) and 23(b) are conceptual diagrams depicting an embodiment in which a film carrier LSI is bonded to a printed circuit board with the aid of an anisotropic conductive film.
Figure 23B:
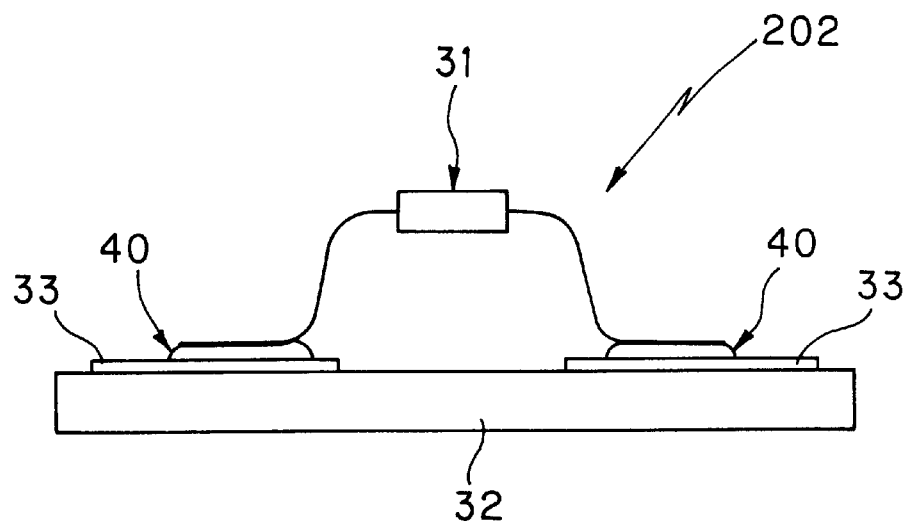
Figure 24:
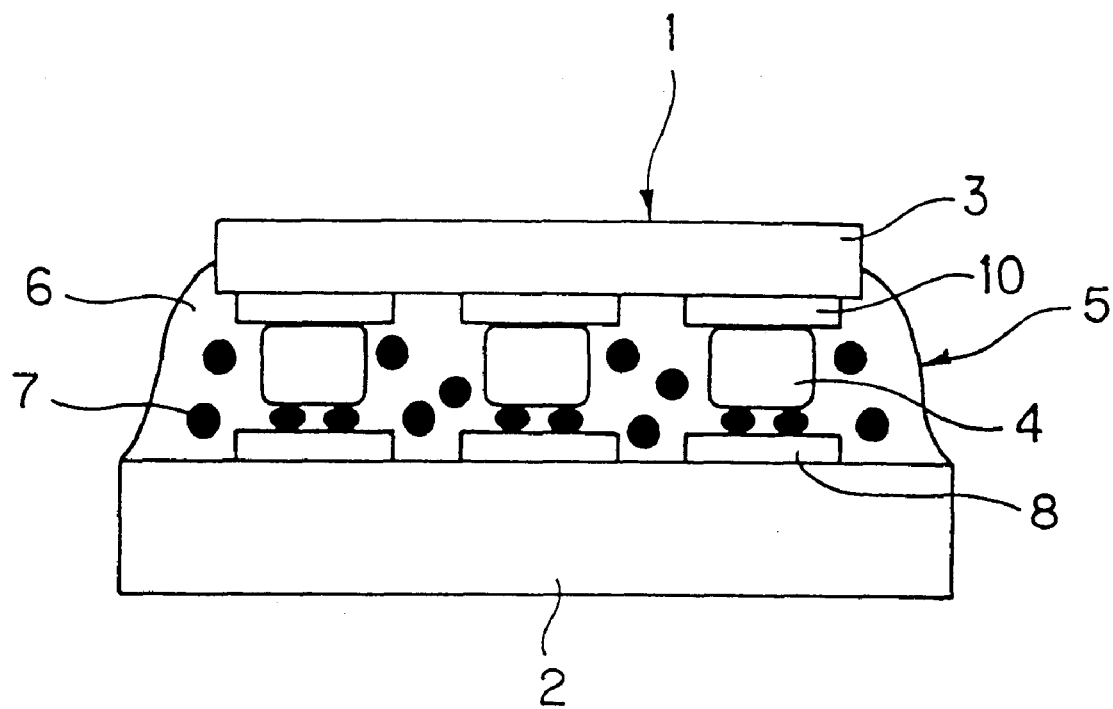
FIG. 24 is a diagram depicting a conventional semiconductor device obtained by mounting a bare IC chip on a printed circuit board.
Figure 25:
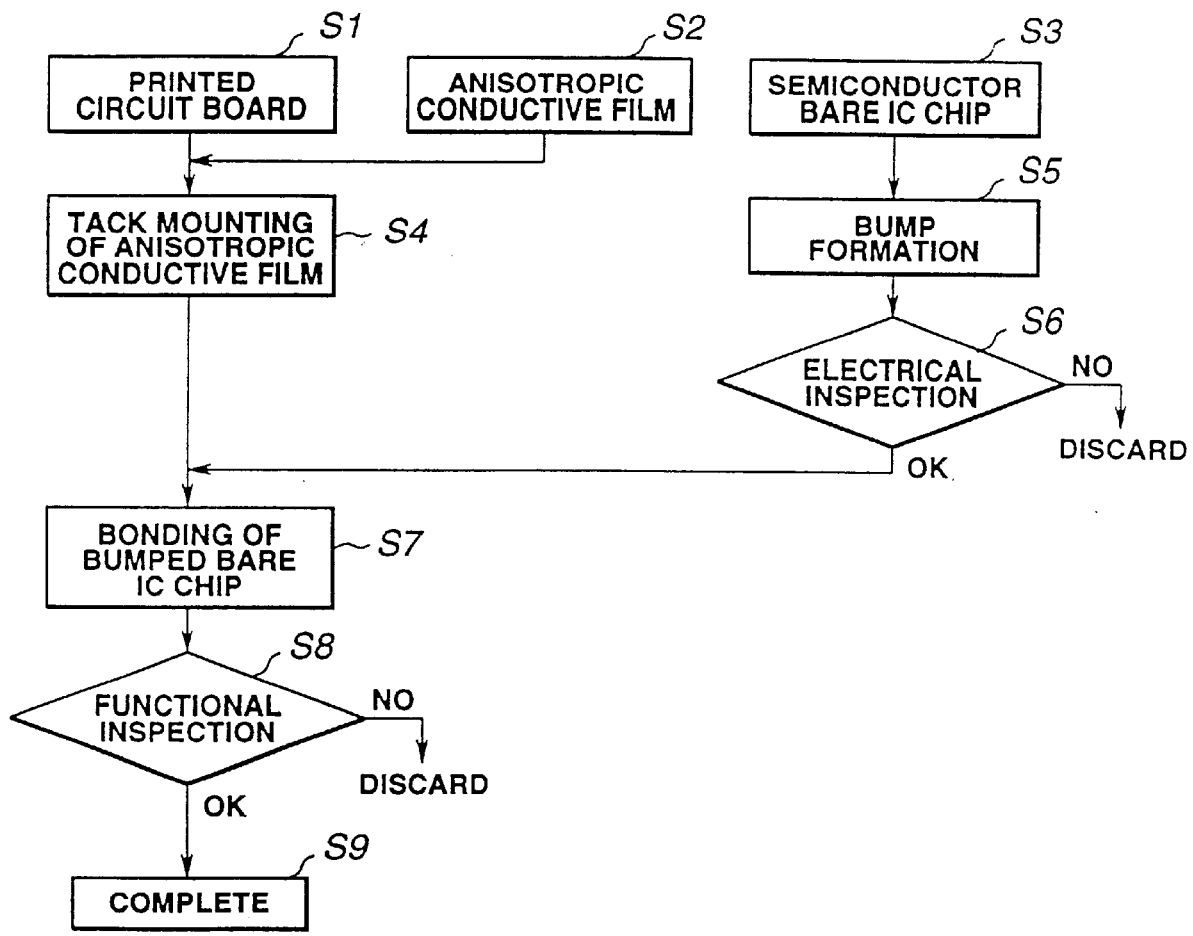
FIG. 25 is a flowchart illustrating a process for manufacturing a semiconductor device by mounting a bare IC chip on a printed circuit board.
Figure 26:
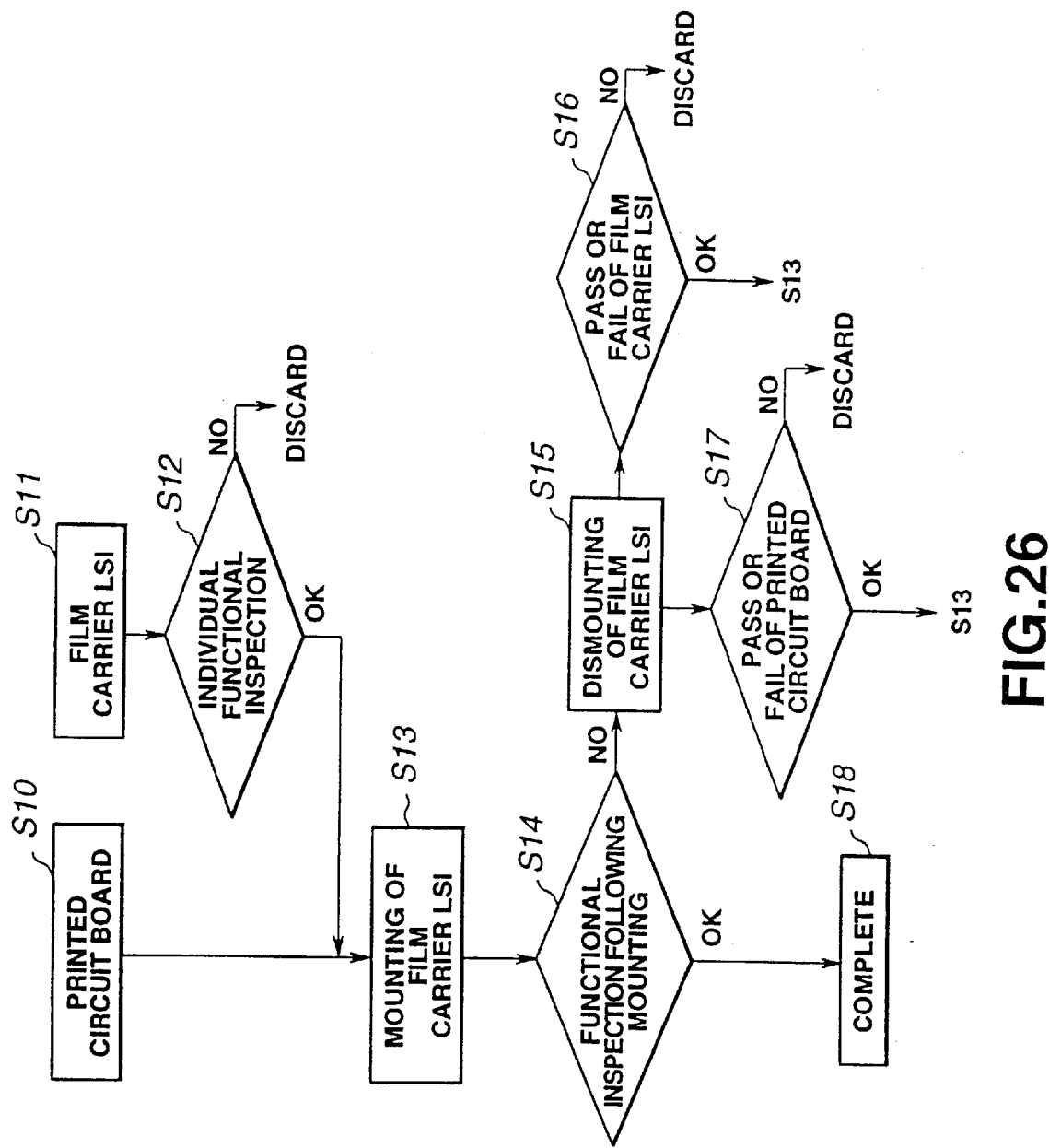
FIG. 26 is a flowchart illustrating a process for manufacturing a semiconductor device by mounting a film carrier LSI on a printed circuit board.

It is further possible to bond the film carrier LSI 31 and the printed circuit board 32 to produce a semiconductor device 202 by the thermocompression bonding of the electrodes 33 of the printed circuit board 32 and the leads of the film carrier LSI 31 through the agency of an anisotropic conductive film 40, as shown in FIGS. 23(a) and 23(b).

Yet another option is to bond the film carrier LSI 31 and the printed circuit board 32 by replacing the anisotropic conductive film 40 with an anisotropic conductive paste composed of the same anisotropic conductive material.

INDUSTRIAL APPLICABILITY

The process for manufacturing a semiconductor device in accordance with the present invention, and the semiconductor component pertaining to the present invention can be used efficiently as a process for manufacturing semiconductor devices for various types of electronic equipment, and as a semiconductor component for such semiconductor devices.

What is claimed is:

1. A process for manufacturing a semiconductor device by mounting a semiconductor component on a printed circuit board to produce the semiconductor device, comprising the steps of:

mounting the semiconductor component on the printed circuit board, with electrodes of the semiconductor component striking against electrodes of the printed circuit board, so that the electrodes of the semiconductor component are electrically connected to, and are mechanically disconnected from, the electrodes of the printed circuit board;

inspecting a function as the semiconductor device with the semiconductor component being mounted on the printed circuit board;

bonding the electrodes of the printed circuit board and the electrodes of the mounted semiconductor component to thereby form the semiconductor device when the inspection result is more than a predetermined value; and replacing at least one of the printed circuit board and the semiconductor component with another one of the same type, and again inspecting the function as the semiconductor device when the inspection result is less than the predetermined value.

2. The process for manufacturing a semiconductor device according to claim 1, wherein a pressure is applied so as to electrically connect together the electrodes of the printed circuit board and the electrodes of the semiconductor component contacting the electrodes of the printed circuit board in a state in which the semiconductor component is mounted on the printed circuit board.

3. The process for manufacturing a semiconductor device according to claim 1 or 2, wherein the semiconductor component is an IC chip.

4. The process for manufacturing a semiconductor device according to claim 3, wherein the IC chip is provided with connection electrode pads for connection to the electrodes of the printed circuit board on a first side thereof and inspection electrode pads for inspection on a second side thereof which is opposite to the first side.

5. The process for manufacturing a semiconductor device according to claim 3, wherein the electrodes of the printed circuit board and the electrodes of the IC chip to be connected to the electrodes of the printed circuit board are electrically bonded with the aid of an anisotropic conductive material.

6. The process for manufacturing a semiconductor device according to claim 3, wherein the IC chip is provided with protrusions formed on the connection electrode pads for connection with the electrodes of the printed circuit board, and is connected to the printed circuit board via the protrusions.

7. The process for manufacturing a semiconductor device according to claim 4, wherein the functional inspection is performed by bringing inspection pins into contact with the inspection electrode pads of the bare IC chip.

8. The process for manufacturing a semiconductor device according to claim 4, wherein the inspection electrode pads on the IC chip are sealed with a resin sealant.

9. The process for manufacturing a semiconductor device according to claim 1 or 2, wherein the semiconductor component is a film carrier LSI.

10. The process for manufacturing a semiconductor device according to claim 9, wherein the functional inspection is performed by bringing inspection pins into contact with the electrodes of the printed circuit board.

11. The process for manufacturing a semiconductor device according to claim 9, wherein the electrodes of the printed circuit board and the electrodes of the film carrier LSI are bonded by intermetallic bonding.

12. The process for manufacturing a semiconductor device according to claim 9, wherein the electrodes of the printed circuit board and the electrodes of the film carrier LSI are bonded via an anisotropic conductive material.

13. The process for manufacturing a semiconductor device according to claim 4, wherein the electrodes of the printed circuit board and the electrodes of the IC chip to be connected to the electrodes of the printed circuit board are electrically bonded with the aid of an anisotropic conductive material.

14. The process for manufacturing a semiconductor device according to claim 4, wherein the IC chip is provided with protrusions formed on the connection electrode pads for connection with the electrodes of the printed circuit board, and is connected to the printed circuit board via the protrusions.

15. The process for manufacturing a semiconductor device according to claim 5, wherein the IC chip is provided with protrusions formed on the connection electrode pads for connection with the electrodes of the printed circuit board, and is connected to the printed circuit board via the protrusions.

16. The process for manufacturing a semiconductor device according to claim 5, wherein the functional inspection is performed by bringing inspection pins into contact with the inspection electrode pads of the IC chip.

17. The process for manufacturing a semiconductor device according to claim 6, wherein the functional inspection is performed by bringing inspection pins into contact with the inspection electrode pads of the IC chip.

18. The process for manufacturing a semiconductor device according to claim 5, wherein the inspection electrode pads on the IC chip are sealed with a sealant.

19. The process for manufacturing a semiconductor device according to claim 6, wherein the inspection electrode pads on the IC chip are sealed with a sealant.

* * * * *